(12) United States Patent
Delhougne et al.

(10) Patent No.: US 8,263,471 B2
(45) Date of Patent: Sep. 11, 2012

(54) MULTILAYER STRUCTURE COMPRISING A PHASE CHANGE MATERIAL LAYER AND METHOD OF PRODUCING THE SAME

(75) Inventors: Romain Delhougne, Muizen (BE); Judit Lisoni, Oud-Heverlee (BE); Vasile Paraschiv, Kessel-Lo (BE)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 12/812,009

(22) PCT Filed: Jan. 12, 2009

(86) PCT No.: PCT/IB2009/050104
§ 371 (c)(1),
(2), (4) Date: Jul. 7, 2010

(87) PCT Pub. No.: WO2009/090589
PCT Pub. Date: Jul. 23, 2009

(65) Prior Publication Data
US 2010/0276657 A1    Nov. 4, 2010

(30) Foreign Application Priority Data
Jan. 16, 2008 (EP) .................................. 08100537

(51) Int. Cl.
*H01L 21/20* (2006.01)
(52) U.S. Cl. ................ 438/382; 438/384; 257/E21.004
(58) Field of Classification Search .................. 438/382, 438/384; 257/E21.004
See application file for complete search history.

(56) References Cited

U.S. PATENT DOCUMENTS

| 5,670,298 A * | 9/1997 | Hur ............................. 430/318 |
| 2005/0032374 A1 | 2/2005 | Spandre |
| 2005/0040136 A1 | 2/2005 | Lee et al. |
| 2006/0040459 A1* | 2/2006 | Phan et al. .................... 438/382 |
| 2006/0284158 A1 | 12/2006 | Lung et al. |
| 2007/0063180 A1 | 3/2007 | Asano et al. |
| 2007/0154847 A1 | 7/2007 | Chen et al. |

FOREIGN PATENT DOCUMENTS

| WO | 2004034482 A2 | 4/2004 |
| WO | 2004057618 A2 | 7/2004 |
| WO | 2004057684 A1 | 7/2004 |
| WO | 2005041196 A1 | 5/2005 |
| WO | 2005093839 A2 | 10/2005 |
| WO | 2006035326 A1 | 4/2006 |
| WO | 2006043230 A1 | 4/2006 |
| WO | 2006079952 A1 | 8/2006 |

OTHER PUBLICATIONS

International Search Report and Written Opinion for Application PCT/IB2009/050104 (Jan. 12, 2009).

* cited by examiner

*Primary Examiner* — Tucker Wright (57) ABSTRACT

A method of producing a multilayer structure is provided, wherein the method comprises forming a phase change material layer onto a substrate, forming a protective layer, forming a further layer on the protective layer, patterning the further layer in an first patterning step, patterning the protective layer and the phase change material layer by a second patterning step. In particular, the first patterning step may be an etching step using chemical etchants. Moreover, electrodes may be formed on the substrate before the phase change material layer is formed, e.g. the electrodes may be formed on one level, e.g. may form a planar structure and may not form a vertically structure.

7 Claims, 6 Drawing Sheets

MULTILAYER STRUCTURE COMPRISING A PHASE CHANGE MATERIAL LAYER AND METHOD OF PRODUCING THE SAME

FIELD OF THE INVENTION

The invention relates to a multilayer structure comprising a phase change material layer, in particular to a memory cell comprising a phase change material layer.

The invention further relates to a method of producing a multilayer structure comprising a phase change material layer.

BACKGROUND OF THE INVENTION

In the field of non-volatile memories, flash memory scaling beyond a 45 nm node has become a real issue. Technologies to face this challenge are ferroelectric, magnetic and phase change memories, the latter one being promising for the replacement of flash and showing characteristics that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. The ability of these materials to undergo fast phase transition has led to the development of rewritable optical media (CD, DVD). The chalcogenide phase change materials may be divided in two classes which are slightly different compositions, based on their crystallization mechanism. The "nucleation dominated" material $GeTe\text{-}Sb_2Te_3$ tie line such as $Ge_2Sb_2Te_5$ are generally used in ovonic unified memory (OUM) devices. In this concept, the phase change material may be in contact with a bottom-resistive electrode to switch reversibly to a small volume of phase change material. "Fast growth material", known in optical storage application (CD-RW/DVD+RW), enable very fast switching (for instance 10 ns) with a proper phase stability.

Thus, phase change materials may be used to store information. The operational principle of these materials is a change of phase. In a crystalline phase, the material structure is, and thus properties are, different from the properties in the amorphous phase.

The programming of a phase change material is based on the difference between the resistivity of the material and its amorphous and crystalline phase. To switch between both phases, an increase of the temperature is required. Very high temperatures with rapid cooling down will result in an amorphous phase, whereas a smaller increase in temperature or slower cooling down leads to a crystalline phase. Sensing the different resistances may be done with a small current that does not cause substantial heating.

The increase in temperature may be obtained by applying a pulse to the memory cell. A high current density caused by the pulse may lead to a local temperature increase. Depending on the duration and amplitude of the pulse, the resulting phase will be different. A fast cooling and large amplitude may quench the cell in an amorphous phase, whereas a slow cooling down and a smaller amplitude pulse may allow the material to crystallize. Larger pulse amplitudes, so-called RESET pulses, may amorphize the cells, whereas smaller pulse amplitudes will SET the cell to its crystalline state, these pulses are also called SET pulses.

However, the known processes for producing phase change memories may be handicapped by the fact that it is hard to pattern the phase change materials without changing the properties of the phase change material.

OBJECT AND SUMMARY OF THE INVENTION

It may be an object of the invention to provide a multilayer structure comprising a phase change material layer and a method of producing the same, wherein the method may provide an efficient procedure for patterning the phase change material layer of the multilayer structure.

In order to achieve the object defined above, a multilayer structure comprising a phase change material layer and a method of producing the same, according to the independent claims are provided.

According to an exemplary embodiment of the invention a method of producing a multilayer structure is provided, wherein the method comprises forming a phase change material layer onto a substrate, forming a protective layer, forming a further layer on the protective layer, patterning the further layer in an first patterning step, patterning the protective layer and the phase change material layer by a second patterning step. In particular, the first patterning step may be an etching step using chemical etchants. Moreover, electrodes may be formed on the substrate before the phase change material layer is formed, e.g. the electrodes may be formed on one level, e.g. may form a planar structure and may not form a vertically structure. Furthermore, the protective layer may comprise or may be consist of an insulating material, e.g. a nitride or an oxide dielectric.

According to an exemplary embodiment a multilayer structure comprising a phase change material is provided, wherein the multilayer structure comprises a substrate, two electrodes, a phase change material layer, and a protective insulating layer, wherein the two electrodes are arranged on the substrate, wherein the phase change material is arranged on the two electrodes, and wherein the insulating layer is arranged on the phase change material layer. In particular, the insulating layer may be arranged directly on the phase change material. Moreover, the multilayer structure may be a planar structure, e.g. the two electrodes may be arranged on a same level and may not be arranged vertically staggered with respect to each other. Furthermore, the phase change material layer may be arranged on or between the two electrodes in such a manner that it electrically connects the two electrodes.

In this application the term "phase change material layer" may particularly denote any layer comprising or consisting of a material that has an ability to undergo fast phase transformation. In general, phase change materials (PCM) may comprise or may consist of germanium, antimony, and tellurium or mixtures thereof. In particular, chalcogenide PCM are divided in two classes with slightly different compositions, based on their crystallization mechanism. The so-called "nucleation dominated" materials along the $GeTe\text{-}Sb_2Te_3$ tie line such as $Ge_2Sb_2Te_5$ and the so-called "Fast growth" materials, known in optical storage application (CD-RW/DVD+RW), enable very fast switching (10 ns), with an improved phase stability. They may be used in the so-called phase change line cell concept. In this approach, the active part of the memory device is a PCM line formed in-between two Cu barrier electrodes deposited on top of a Backend Of Line Process (BEOL) of a CMOS based front end of line.

By providing a protective insulating layer it may be possible to efficiently pattern or structure a multilayer structure comprising a phase change material layer. The protective layer may form a protection for the underlying phase change material layer so that even standard, aggressive etchants, like brome, fluorine, or chloride, may be used without deterioration of the PCM layer. Additionally, also it may be possible to avoid that nitrogen or oxygen plasmas will come in contact with the PCM. Furthermore, the protective insulating layer may also form a mask for subsequent patterning steps. Moreover, the process may be implementable or integrable into standard CMOS procedures. In particular, the structure and properties of the PCM may remain intact, which PCM layer may be part of an active region of a memory device. Using a method according to an exemplary embodiment of the invention may also avoid that the further layer, e.g. a bottom-antireflection coating layer (BARC), opening re-sputters the PCM at the side of a photo-resist used to pattern the further layer, leaving PCM residues after resist strip that are extremely difficult to remove. These PCM residues could be removed by wet strip treatment in known procedures, which however would strongly attack the PCM and/or depletes it in one or more elements leading to altered performances of the device. Since these PCM residues may be avoided when using a method according to an exemplary embodiment of the invention these wet strip treatment and the resulting drawbacks may be avoidable. Thus, it may be possible to protect the PCM from patterning chemistries in the first patterning so that standard processes may be used without affecting the PCM.

A gist of an exemplary aspect of the invention may be seen in the using of a protective layer formed on a phase change material layer which protective layer may be used to protect the PCM layer in patterning steps of layers formed on the protective layer. Thus, it may be possible to use standard patterning procedures without deteriorate the properties of the PCM layer. Residues of the protective layer and the patterning of the PCM layer may be performed by sputter dominated processes, e.g. Ar sputtering, which may not deteriorate the properties of the PCM to a great extend.

Next, further exemplary embodiments of the method of producing a multilayer structure are described. However, these embodiments also apply to the multilayer structure.

According to another exemplary embodiment of the method the second patterning step is a sputter dominated process, in particular an anisotropic sputter dominated process.

The term "sputter dominated process" may particularly denote a material removing process which is based mainly or predominantly on sputtering or physical interaction, e.g. on high energetic ions. However, small amounts of chemical etchants may be used in connection with the sputtering process. Thus, the sputter dominated process has to be delimited against a chemical etching process in which the material removing is predominantly performed due to chemical interactions between the material to be removed and the etchant. Such a sputter dominated process may be in particular efficient for removing a phase change material layer since in such a sputter dominated process the phase change material may be less altered compared to a chemical etching process. In particular, the protective insulating layer may comprise a material adapted to protect the phase change material layer from etchants, which may be used by stripping a photoresist layer or a bottom-antireflection coating.

According to another exemplary embodiment of the method in the first patterning step the protective insulating layer is partially patterned. In particular, the protective insulating layer may be partially removed by the first patterning step, e.g. upper or top portions of the protective insulating layer may be removed so that a minimal protective layer still remains on the phase change material layer.

According to another exemplary embodiment of the method the further layer is a bottom-antireflection coating.

According to another exemplary embodiment of the method a first sublayer forms the protective insulating layer and a second sublayer formed on the first sublayer. In particular, the first sublayer may be formed directly onto the phase change material layer to form a first covering layer, while the second sublayer may be formed onto the first sublayer. Moreover, the first sublayer and the second sublayer may have different thicknesses.

According to another exemplary embodiment of the method the first sublayer comprises a first material, the second sublayer comprises a second material, and the first material and the second material is different. In particular, the first sublayer may consist of the first material and/or the second sublayer may consist of the second material. By providing two sublayers it may be possible to tailor the patterning process of the layers formed on the protective layer to the materials of the respective layers, while a second patterning process may be used for the PCM layer. In particular, it may be possible that one, e.g. the first, of the sublayers forms a patterning or etch stop layer for a patterning step.

According to another exemplary embodiment of the method in the second patterning step the protective insulating layer is used as a masking layer for the patterning of the phase change material layer.

Summarizing, a gist of an exemplary aspect of the present invention may be to provide a method wherein a protective layer may be formed on a phase change material (PCM) layer which may be used to protect the PCM layer in patterning steps. This may be a new concept for patterning PCM, which may be applicable in so-called line cell PC memory. In general the method may be applicable to any devices where the patterning of PCM is needed. The protective layer may further serve as a hard mask during PCM patterning and may be used to avoid contact between standard aggressive etching chemistries and the PCM so that the properties of the PCM may remain intact. Summarizing the control of very thin PCM layer patterning may be improved, while standard CMOS processing may be usable which may enable an easy integration of the method according to an exemplary aspect of the invention into standard procedures.

The aspects and exemplary embodiments defined above and further aspects of the invention are apparent from the example of embodiment to be described hereinafter and are explained with reference to these examples of embodiment. It should be noted that features described in connection with one exemplary embodiment or exemplary aspect may be combined with other exemplary embodiments and other exemplary aspects.

BRIEF DESCRIPTION OF THE DRAWINGS

The invention will be described in more detail hereinafter with reference to examples of embodiment but to which the invention is not limited.

DESCRIPTION OF EMBODIMENTS

The illustration in the drawing is schematically. In different drawings, similar or identical elements are provided with similar or identical reference signs.

FIG. 1 shows a schematically process flow for patterning a phase change material layer according to a first exemplary embodiment of the invention. In particular, F*ig*. 1A shows a multilayer structure 100 which may be a part of a memory cell, wherein the multilayer structure 100 comprises a base layer 101 and two conductor paths 102 and 103 burrowed in the substrate 101 or formed by a damascene process. The conductor paths may be formed of metal, e.g. copper. The conductor paths 102 and 103 are connected to electrodes 104 and 105, respectively, which may be formed by tantalum-nitride (TaN) for example. On the substrate 101 and the electrodes 104 and 105 a phase change material (PCM) layer 106 is formed e.g. by using GeTe-$Sb_2Te_3$ such as $Ge_2Sb_2Te_5$. Onto the PCM layer 106 a protective layer 107, e.g. a protective insulating layer comprising nitride or oxide dielectric, is formed. Afterwards a photolithography process is used, e.g. a bottom-antireflection coating (BARC) layer 108 and a photo resist layer 109 are spin coated, exposed and the photoresist is developed.

Figure 1A:
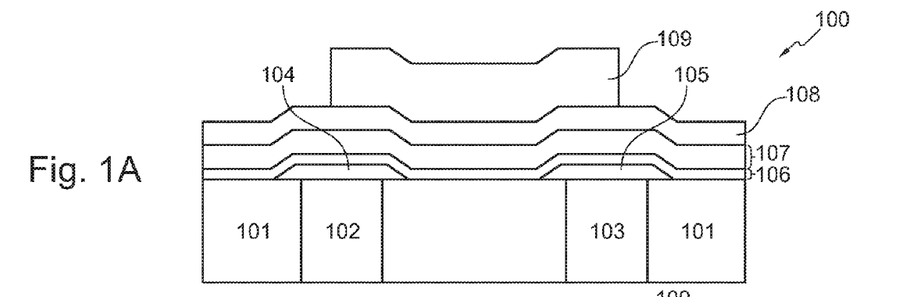
FIG. 1 schematically illustrates a process flow for patterning a phase change material layer according to a first exemplary embodiment of the invention.
Figure 1B:
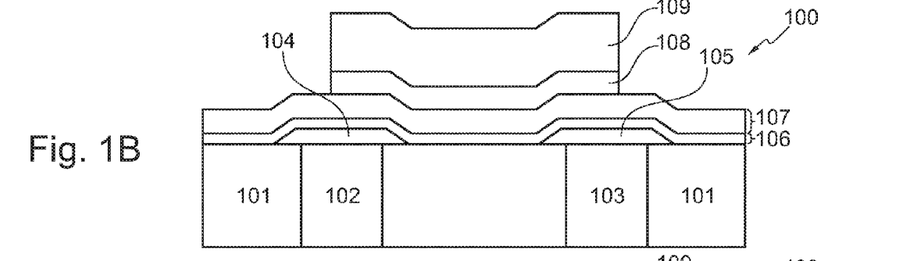

FIG. 1B shows the multilayer structure 100 after a dry etching step is performed to open or pattern the BARC layer 108. This step may be performed by standard chemistry, e.g. $HBr/O_2$. The etching process may be stopped by endpoint detection selectively towards the protective layer 107. It should be noted that the PCM layer 106 does not come in contact with any chemistry, e.g. etchant, in that step.

Figure 1C:
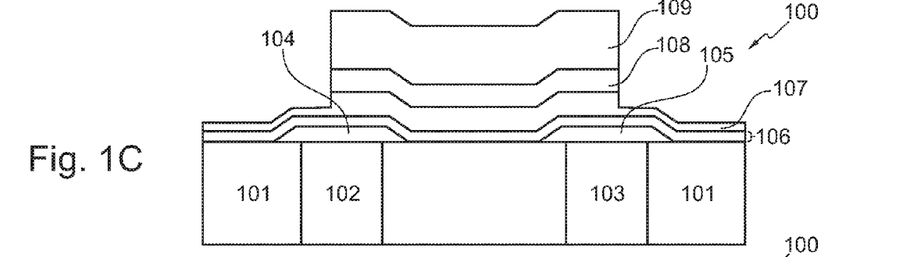

FIG. 1C shows the multilayer structure 100 after the protective layer is partially opened or patterned. In particular, the protective layer 107 is partially opened by using appropriate chemistry, e.g. fluorine based chemistry in case of a nitride or oxide dielectric. The photoresist layer 109 serves as a masking layer for patterning the protective layer 107 as well. The process is stopped before the chemistry comes in contact with the PCM layer 106.

Figure 1D:
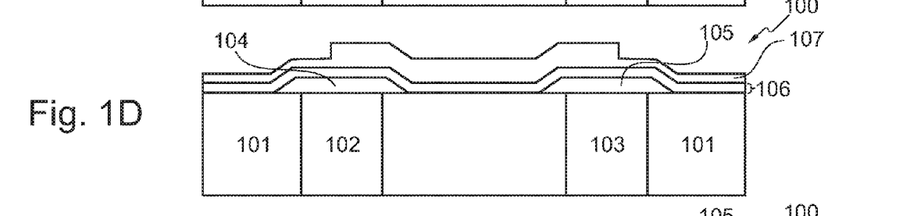

FIG. 1D shows the multilayer structure 100 after the photoresist 109 and the BARC layer 108 are stripped. This may be done by using standard chemistry, e.g. by using $O_2$, $N_2$ or $SF_6$. Since the PCM layer 106 is still protected by the protective layer 107 it is not deteriorated by the chemistry.

Figure 1E:
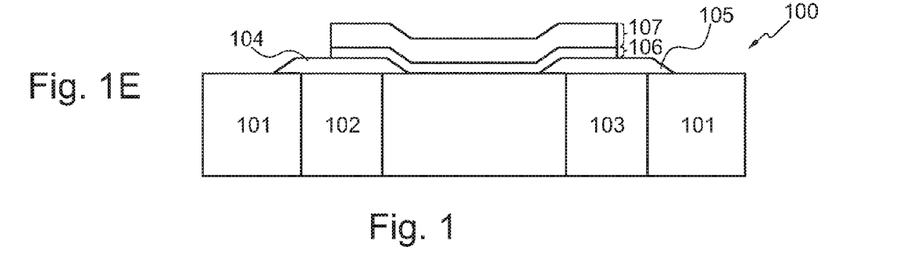

F*ig*. 1E shows the multilayer structure 100 after the protective layer 107 is opened and the PCM layer 106 is patterned. In particular, the patterning of the protective layer 107 is finished and the PCM layer 106 is patterned by a highly anisotropic sputter dominated process. During this process step the protective layer may be used as a mask to pattern the PCM layer 106.

As a consequence of this patterning scheme, the PCM layer 106 is only exposed to a sputter dominated process and mild chemistries during the last etching step. All other etching steps may be performed by using standard chemistries and do not touch the PCM. Thus, the PCM layer 106 may be reproducibly patterned without alteration of its composition. Furthermore, no residues may be created as can be seen in FIG. 4C, which will be described in more detail in the following.

Figure 2A:
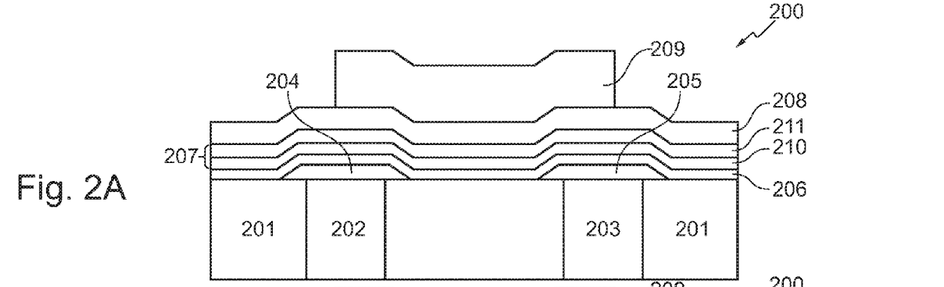
FIG. 2 schematically illustrates a process flow for patterning a phase change material layer according to a second exemplary embodiment of the invention.
Figures 2B, 2C:
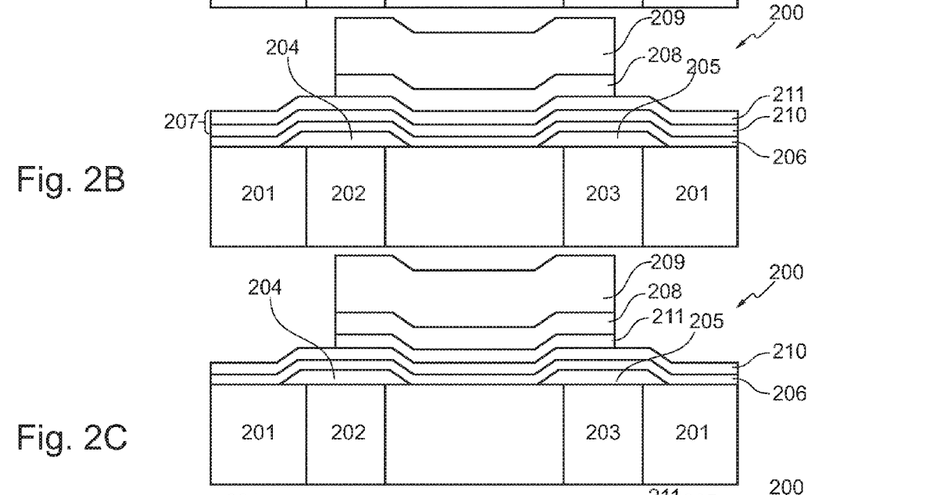
Figures 2D, 2E:
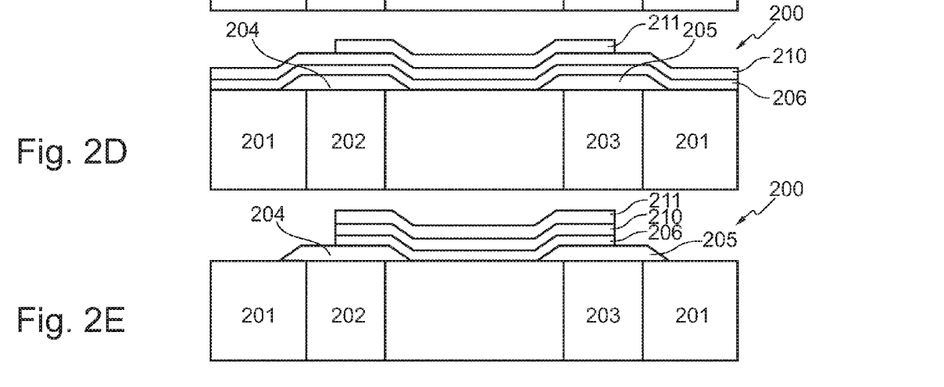

FIG. 2 shows a schematically process flow for patterning a phase change material layer according to a second exemplary embodiment of the invention. The process is similar to the process described with reference to FIG. 1. Thus, mainly the differences will be described in more detail. The main difference is that a first sublayer 210 and a second sublayer 211 form a protective layer 207. In particular, FIG. 2A shows a multilayer structure 200 which may be a part of a memory cell, wherein the multilayer structure 200 comprises a base layer 201 and two conductor paths 202 and 203 burrowed in the substrate 201 or formed by a damascene process. The conductor paths may be formed of metal, e.g. copper. The conductor paths 202 and 203 are connected to electrodes 204 and 205, respectively, which may be formed by tantalum-nitride (TaN) for example. On the substrate 201 and the electrodes 204 and 205 a phase change material (PCM) layer 106 is formed, e.g. by using GeTe-$Sb_2Te_3$ such as $Ge_2Sb_2Te_5$. Onto the PCM layer 206 a protective layer 207, e.g. a protective insulating layer comprising nitride or oxide dielectric, is formed. As already indicated the protective layer 207 comprises to sublayers 210 and 211, e.g. a bottom layer and a top layer, which may have different thicknesses and may comprise or consists of different materials. Afterwards a photolithography process is used, e.g. a bottom-antireflection coating (BARC) layer 208 and a photo resist layer 209 are spin coated, exposed and the photoresist is developed.

The patterning process is the same as described with respect to FIG. 1. However, the bottom layer 210 of the protective layer 207 may be used as a stopping layer during the patterning or opening of the top layer 211 of the protective layer 207. Then the bottom layer 210 and the PCM layer 206 may be etched together in the last etching step, e.g. a sputter dominated etching step.

Figure 3:
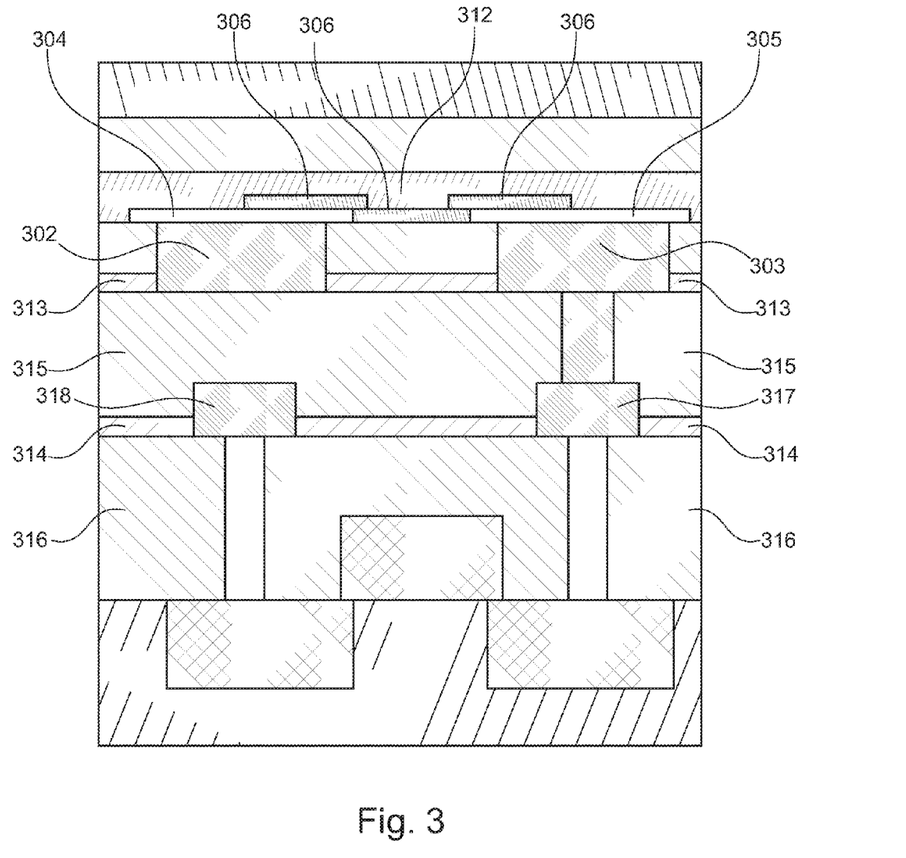
FIG. 3 schematically illustrates an overview of a phase change memory based on the so-called line cell concept.

FIG. 3 schematically illustrates a basic overview of a phase change memory based on the so-called line cell concept in which a multilayer structure shown in FIG. 1 and FIG. 2 may be used. In particular, FIG. 3 shows a PCM layer 306 connecting two electrodes 304 and 305 that are connected to conductor paths 302 and 303, respectively. Furthermore, a base layer 301 is depicted. For sake of clarity a protective layer covering the PCM layer 306 is not shown in FIG. 3. Additionally, a passivation layer 312 is shown together with additionally layers 313 and 314, e.g. made of silicone-carbide, 315 and 316, e.g. made of oxide and some metallic layers 317 and 318.

Figure 4A:
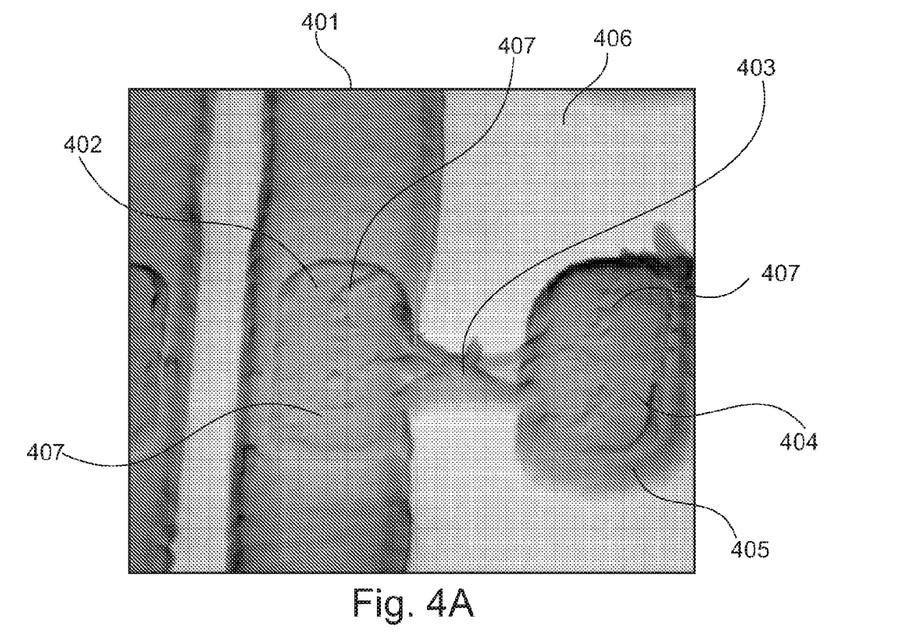
FIG. 4 shows images showing phase change material cells.
Figure 4B:
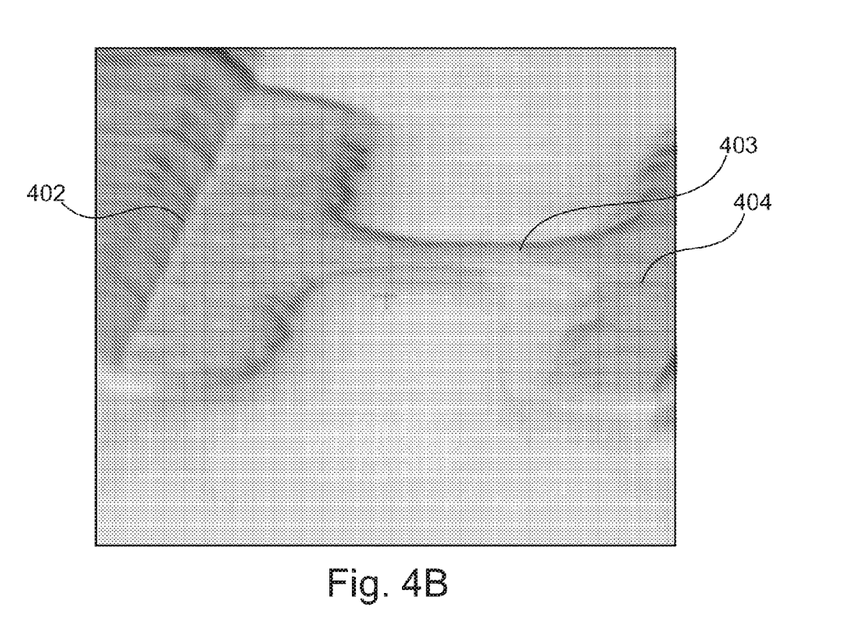
Figure 4C:
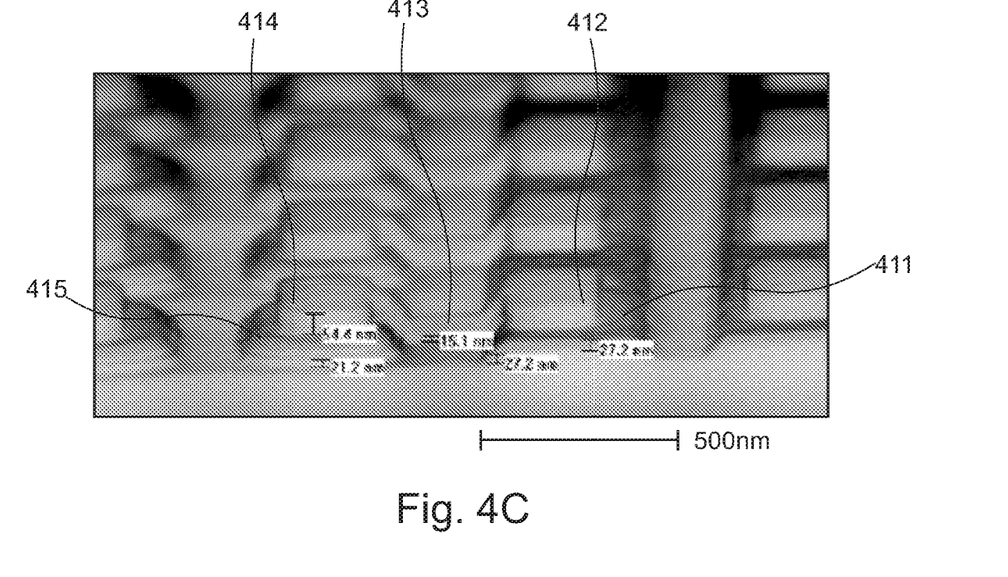

FIG. 4 shows images a standard illustrating phase change material cells. In particular, FIG. 4A shows a bitline 401 having a first PCM region 402 on top which is connected by a PCM line 403 to a second PCM region 404 which is arranged on an electrode 405. A dielectric layer 406, e.g. an oxide layer, surrounds the electrode and the bitline. Furthermore, a plurality of PCM residues 407 can be seen on the PCM regions which may be caused by an BARC opening which is stopped on the PCM layer, in case no protective layer is used, from which the PCM regions 402 and 404 and the PCM line is formed. FIG. 4B shows the result of a standard process in which the PCM residues shown in FIG. 4A are removed by wet stripping, leading to a strongly attacked PCM layer, e.g. PCM regions 402 and 404 and PCM line 403.

In contrast to the FIGS. 4A and 4B, FIG. 4C now shows a PCM line cell memory that is fabricated using a protective layer during patterning. In particular, FIG. 4C shows a bitline 411 having a first PCM region 412 on top of it, which is connected by a PCM line 413 to a second PCM region 414, which in turn is formed on an electrode 415. It can be seen in FIG. 4C that the different PCM regions are less deteriorated or attacked from the patterning while virtually no PCM residues can be seen in FIG. 4C.

Figure 5:
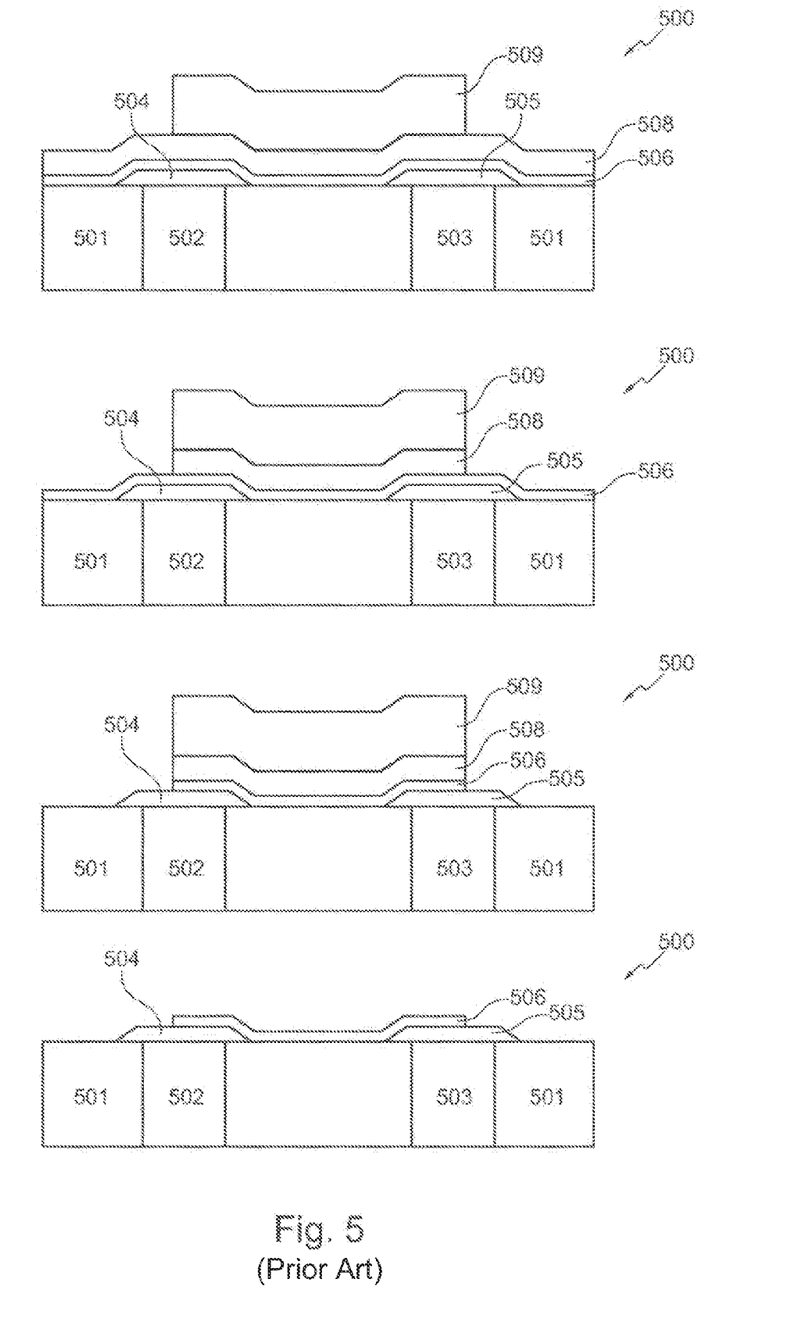
FIG. 5 schematically illustrates work flow of a standard patterning scheme.

FIG. 5 schematically illustrates workflow of a standard patterning scheme without using a protective layer. In particular, FIG. 5A shows a multilayer structure 500 wherein the multilayer structure 500 comprises a base layer 501 and two conductor paths 502 and 503 burrowed in the substrate 501 or may be formed by a damascene process. The conductor paths may be formed of metal, e.g. copper. The conductor paths 502 and 503 are connected to electrodes 504 and 505, respectively, which may be formed by tantalum-nitride (TaN) for example. On the substrate 501 and the electrodes 504 and 505 a phase change material (PCM) layer 506 is formed, e.g. by using GeTe-$Sb_2Te_3$ such as $Ge_2Sb_2Te_5$. Afterwards a photolithography process is used, e.g. a bottom-antireflection coating (BARC) layer 508 and a photo resist layer 509 are spin coated, exposed and the photoresist is developed. The standard process is similar to the one described with respect to FIG. 1 however, since no protective layer is used the PCM layer 506 will be deteriorated by the patterning steps, in particular in the step of stripping the BARC layer 508.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item. The mere fact that certain measures are recited in mutually different dependent claims does not indicate that a combination of these measures cannot be used to advantage.

The invention claimed is:

1. A method of producing a multilayer structure, the method comprising:
    forming electrodes on a substrate,
    forming a phase change material layer onto the electrodes,
    forming a protective layer,
    forming a further layer on the protective layer,
    forming a photoresist layer on the protective layer,
    patterning the further layer in a first patterning step,
    etching a first portion of the protective layer that is defined using the photoresist layer as a mask to cause the first portion of the protective layer to have a thickness less than a second portion of the protective layer,
    removing the photoresist layer and the further layer,
    patterning the protective layer and the phase change material layer by a second patterning step utilizing the second portion of the protective layer as a mask.

2. The method according to claim 1, wherein the second patterning step is a sputter dominated process.

3. The method according to claim 1, wherein in the first patterning step the protective layer is partially patterned.

4. The method according to claim 1, wherein the further layer is a bottom-antireflection coating.

5. The method according to claim 1, wherein the protective layer is formed by a first sublayer and a second sublayer formed on the first sublayer.

6. The method according to claim 5,
    wherein the first sublayer comprises a first material,
    wherein the second sublayer comprises a second material,
    wherein the first material and the second material is different.

7. The method according to claim 1, wherein in the second patterning step the protective layer is used as a masking layer for the patterning of the phase change material layer.

* * * * *